(12) United States Patent
Zhao et al.

(10) Patent No.: US 11,456,346 B2
(45) Date of Patent: Sep. 27, 2022

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Yong Zhao, Hubei (CN); Zuomin Liao, Hubei (CN); Tao Chen, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 415 days.

(21) Appl. No.: 16/640,256

(22) PCT Filed: Nov. 6, 2019

(86) PCT No.: PCT/CN2019/116106
§ 371 (c)(1),
(2) Date: Feb. 19, 2020

(87) PCT Pub. No.: WO2021/027107
PCT Pub. Date: Feb. 18, 2021

(65) Prior Publication Data
US 2021/0408200 A1 Dec. 30, 2021

(30) Foreign Application Priority Data
Aug. 9, 2019 (CN) .......................... 201910736046.2

(51) Int. Cl.
*H01L 27/32* (2006.01)

(52) U.S. Cl.
CPC ........ *H01L 27/3276* (2013.01); *H01L 27/326* (2013.01); *H01L 27/3227* (2013.01)

(58) Field of Classification Search
CPC .................................................. H01L 27/3276
See application file for complete search history.

(56) References Cited

U.S. PATENT DOCUMENTS

| 2016/0111487 A1* | 4/2016 | Jeong | ..................... H01L 27/326 |
| | | | 257/40 |
| 2017/0077209 A1* | 3/2017 | Kim | ...................... H01L 27/326 |
(Continued)

FOREIGN PATENT DOCUMENTS

| CN | 107610635 A | 1/2018 |
| CN | 110047892 A | 7/2019 |
(Continued)

*Primary Examiner* — Douglas M Menz

(57) ABSTRACT

The present invention provides a display panel and a display device. The display panel includes a main display region and at least one function add-on region, the function add-on region includes at least one display light-transmitting region, a plurality of first pixel driving circuits are disposed at a periphery of the display light-transmitting region, and a multiple layers transparent lines is disposed to electrically connect a first pixel anode and the first pixel driving circuits to drive first display pixels to emit light, which is beneficial for increasing wiring space, as well as improving light transmittance, photographing effect, and display effect of under-screen cameras.

20 Claims, 14 Drawing Sheets

(56) References Cited

U.S. PATENT DOCUMENTS

| | | | | |
|---|---|---|---|---|
| 2017/0160766 A1* | 6/2017 | Gupta | ................... | G02F 1/1368 |
| 2019/0384121 A1* | 12/2019 | Nishiwaki | ......... | G02F 1/133528 |
| 2020/0105843 A1* | 4/2020 | Baek | ................... | H01L 27/3227 |
| 2020/0310180 A1* | 10/2020 | Fu | ....................... | G02F 1/13439 |
| 2021/0020706 A1* | 1/2021 | Chen | ................... | H01L 27/3218 |
| 2021/0143364 A1* | 5/2021 | Jin | ..................... | H01L 51/5234 |
| 2021/0335221 A1* | 10/2021 | Ma | .......................... | G09G 3/32 |
| 2021/0351243 A1* | 11/2021 | Chang | ................ | H01L 51/5281 |
| 2021/0391558 A1* | 12/2021 | Kim | ................... | H01L 51/5275 |
| 2021/0408191 A1* | 12/2021 | Zhao | .................. | H01L 27/3248 |

FOREIGN PATENT DOCUMENTS

| | | |
|---|---|---|
| CN | 110061014 A | 7/2019 |
| CN | 110098238 A | 8/2019 |
| KR | 20170079978 A | 7/2017 |

\* cited by examiner

DISPLAY PANEL AND DISPLAY DEVICE

FIELD OF INVENTION

The present disclosure relates to the field of display technology, and more particularly, to a display panel and a display device.

BACKGROUND OF INVENTION

Full screens have brought a new visual experience and sensory impact due to extremely high screen ratios, and have become a goal pursued by display panel manufacturers.

Full screens have brought a new visual experience and sensory impact due to extremely high screen ratios. At present, a common design of under-screen cameras is to dig holes in a camera region of display panels, and a light-transmitting region of cameras does not display images. This method provides a relatively high panel penetration rate, but does not provide good display experience for users, as full screen effect cannot be presented. Another method is to dispose a display light-transmitting region on the display panels, and dispose an under-screen camera at a position corresponding to the display light-transmitting region of the display panels, thereby improving user experience. However, adoption of such method results in low light transmittance of the display light-transmitting region of the display panels, which leads to poor photographing effect of the under-screen cameras.

In summary, a new display panel and a display device need to be provided to solve the above technical problems.

SUMMARY OF INVENTION

The present disclosure provides a display panel and a display device to solve the technical problem that the light transmittance of the display light-transmitting region of the current display panels is low, so that the photographing effect of the under-screen cameras is poor.

In order to solve the above problems, technical solutions provided by the present disclosure is as follows.

An embodiment of the present disclosure provides a display panel. The display panel comprises a main display region and at least one function add-on region, the function add-on region comprises at least one display light-transmitting region, and a size of the display light-transmitting region ranges from 600 μm to 10000 μm.

The display panel comprises a substrate, wherein a plurality of first pixel driving circuits are disposed at a periphery of the display light-transmitting region and on the substrate in the function add-on region; at least two insulating layers covering the plurality of first pixel driving circuits; transparent lines disposed between the at least two insulating layers; and a plurality of first display pixels disposed at a side of the insulating layers away from the substrate and located in the display light-transmitting region, wherein the first display pixels comprise a first pixel anode.

wherein the first pixel anode is electrically connected to at least a portion of the first pixel driving circuits through the transparent lines to drive the first display pixels to emit light.

According to the display panel provided by the embodiment of the present disclosure, at least a portion of the first pixel anode is located in the display light-transmitting region, and a portion of the transparent lines located at the periphery of the display light-transmitting region and in the function add-on region is electrically connected to the first pixel driving circuits.

According to the display panel provided by the embodiment of the present disclosure, at least a portion of the first pixel anode is located in the main display region, and a portion of the transparent lines located at the periphery of the display light-transmitting region and in the function add-on region is electrically connected to the first pixel driving circuits.

According to the display panel provided by the embodiment of the present disclosure, the transparent lines is at least two layers, a through-hole is defined on each of the insulating layers, and two adjacent layers of the transparent lines are electrically connected through the through-hole.

According to the display panel provided by the embodiment of the present disclosure, a portion of the first display pixels in the plurality of the first display pixels of display light-transmitting region is electrically connected to the first display pixel driving circuits through one layer of the transparent line, and a portion of the first display pixels in the plurality of first display pixels is electrically connected to the first display pixel driving circuits through another layer of the transparent line.

According to the display panel provided by the embodiment of the present disclosure, a portion of the first display pixels in the plurality of the first display pixels of display light-transmitting region is electrically connected to the first display pixel driving circuits through multiple layers of the transparent line, wherein orthographic projections of the multiple layers transparent lines on the substrate at least partially overlap.

An embodiment of the present disclosure further provides a display panel. The display panel comprises a main display region and at least one function add-on region, and the function add-on region comprises at least one display light-transmitting region.

The display panel comprises a substrate, wherein a plurality of first pixel driving circuits are disposed at a periphery of the display light-transmitting region and on the substrate in the function add-on region; at least two insulating layers covering the plurality of first pixel driving circuits; transparent lines disposed between the at least two insulating layers; and a plurality of first display pixels disposed at a side of the insulating layers away from the substrate and located in the display light-transmitting region, wherein the first display pixels comprise a first pixel anode.

wherein the first pixel anode is electrically connected to at least a portion of the first pixel driving circuits through the transparent lines to drive the first display pixels to emit light.

According to the display panel provided by the embodiment of the present disclosure, at least a portion of the first pixel anode is located in the display light-transmitting region, and a portion of the transparent lines located at the periphery of the display light-transmitting region and in the function add-on region is electrically connected to the first pixel driving circuits.

According to the display panel provided by the embodiment of the present disclosure, at least a portion of the first pixel anode is located in the main display region, and a portion of the transparent lines located at the periphery of the display light-transmitting region and in the function add-on region is electrically connected to the first pixel driving circuits.

According to the display panel provided by the embodiment of the present disclosure, the transparent lines is at least two layers, a through-hole is defined on each of the insulating layers, and two adjacent layers of the transparent lines are electrically connected through the through-hole.

According to the display panel provided by the embodiment of the present disclosure, a portion of the first display pixels in the plurality of the first display pixels of display light-transmitting region is electrically connected to the first display pixel driving circuits through one layer of the transparent line, and a portion of the first display pixels in the plurality of first display pixels is electrically connected to the first display pixel driving circuits through another layer of the transparent line.

According to the display panel provided by the embodiment of the present disclosure, a portion of the first display pixels in the plurality of the first display pixels of display light-transmitting region is electrically connected to the first display pixel driving circuits through multiple layers of the transparent line, wherein orthographic projections of the multiple layers transparent lines on the substrate at least partially overlap According to the display panel provided by the embodiment of the present disclosure, a plurality of second display pixels are disposed at a side of the insulating layers away from the substrate and located in the main display region, the second display pixels comprise a second pixel anode, and a plurality of second pixel driving circuits are disposed on the substrate of the main display region to drive the second display pixels to emit light.

According to the display panel provided by the embodiment of the present disclosure, a distance between each two adjacent transparent lines disposed on a same layer is greater than 2 μm, and a width of the transparent lines is greater than 1 μm.

According to the display panel provided by the embodiment of the present disclosure, a plurality of signal lines are disposed on the substrate located at the periphery of the display light-transmitting region, and the plurality of signal lines are electrically connected to the plurality of first pixel driving circuits for transmitting a signal driving the first display pixel to the first pixel anode.

According to the display panel provided by the embodiment of the present disclosure, an area of the function add-on region occupied by the first pixel driving circuits, the signal lines, and the first pixel anodes is less than or equal to 50%, and an area of the display light-transmitting region occupied by the plurality of first pixel anodes is less than 50%.

According to the display panel provided by the embodiment of the present disclosure, the plurality of the first pixel driving circuits are arranged in an array to form a pixel driving circuit island, and the first pixel anodes are electrically connected to the pixel driving circuit island through the transparent line.

According to the display panel provided by the embodiment of the present disclosure, a farthest distance between the first display pixel and the pixel driving circuit island ranges from 300 μm to 5000 μm.

According to the display panel provided by the embodiment of the present disclosure, a conductive layer is disposed between the at least two insulating layers, the conductive layer is located in the main display region, and a plurality of second pixel driving circuits are electrically connected to a plurality of second display pixels to drive the second display pixels to emit light.

An embodiment of the present disclosure further provides a display device. The display device comprises the aforementioned display panel, and a photosensitive element disposed at a side of the display panel and disposed corresponding to the function additional region.

Advantageous effects of the present disclosure are that the present disclosure provides a display panel and a display device. A plurality of first pixel driving circuits are disposed at a periphery of a display light-transmitting region, and multiple layers transparent lines are disposed to electrically connect a first pixel anode and the first pixel driving circuits, so that the first pixel driving circuits drive a first display pixel to emit light, which is beneficial to increase wiring space and improve light transmittance of the display light-transmitting region, thereby improving photographing effect and display effect of under-screen cameras.

DESCRIPTION OF DRAWINGS

In order to more clearly illustrate the technical solutions of the embodiments of the present invention, the drawings used in the description of the embodiments will be briefly described as below. Obviously, the drawings described as below are just some embodiments of the present invention. For one of ordinary skill in the art, under the premise of no creative labor, other drawings can also be obtained according to these drawings.

DETAILED DESCRIPTION OF PREFERRED EMBODIMENTS

The following description of the embodiments with reference to the appended drawings is used for illustrating specific embodiments which may be used for carrying out the present disclosure. The directional terms described by the present disclosure, such as "upper", "lower", "front", "back", "left", "right", "inner", "outer", "side", etc., are only directions by referring to the accompanying drawings. Thus, the adopted directional terms are used to describe and understand the present disclosure, but the present disclosure is not limited thereto. In figures, elements with similar structures are indicated by the same numbers.

The present disclosure is directed to the technical problem that light transmittance of a display light-transmitting region is low, resulting in poor photographing effect of under-screen cameras. The present embodiment may resolve the defects.

Figure 1:
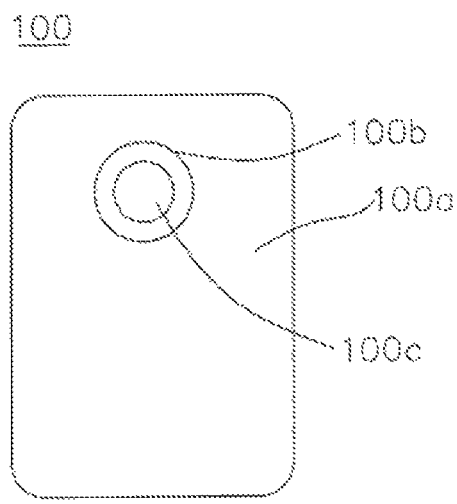
FIG. 1 is a schematic planar structural diagram of a display panel provided by an embodiment of the present disclosure.

As shown in FIG. 1, a display panel 100 provided in an embodiment of the present disclosure is an active matrix organic light-emitting diode display panel. The display panel 100 comprises a main display region 100a and at least one function add-on region 100b, wherein the main display region 100a is a region mainly used to display images, the function add-on region 100b is used to dispose a photosensitive element, and the function add-on region 100b comprises at least one display light-transmitting region 100c. While the display light-transmitting region 100c is used to display images, the photosensitive element located on one side of the display panel 100 and corresponding to the display light-transmitting region 100c receives a light signal through light, wherein the photosensitive element may be a camera, an optical touch component, a fingerprint recognition sensor, etc., so that the display panel 100 may achieve functions such as a camera function, an optical touch function, an optical fingerprint recognition function, etc.

Figure 2:
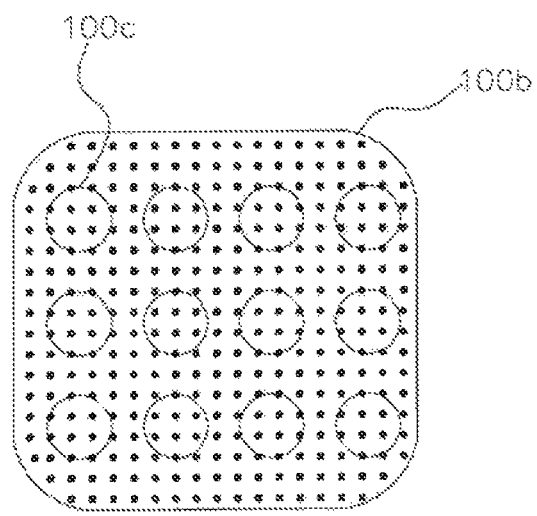
FIG. 2 is a schematic structural planar diagram of a function add-on region provided by the embodiment of the present disclosure.

As shown in FIG. 2, a plurality of the display light-transmitting regions 100c may be disposed in the function add-on region 100b, a shape of the display light-transmitting regions 100c may be circular, rectangular, rectangular with rounded corners, or irregular polygonal, and a size of each of the display light-transmitting regions 100c ranges from 0.36 mm$^2$ to 100 mm$^2$, which ensure that when the camera is correspondingly disposed in the function add-on region 100b of the display panel 100, the process difficulty is reduced, and the camera may have a good photographing effect.

It should be noted that in order to facilitate description of the technical solutions of the embodiment of the present disclosure, in the embodiment of the present disclosure, the display panel 100 has one function add-on regions 100b, and the function add-on region 100b has one display light-transmitting regions 100c for description.

Since the pixel driving circuit of the display panel 100 comprises a plurality of metal film layers, such as polysilicon layers, gate layers, source/drain metal layers, etc., wherein the metal film layers have a light shielding function, a region of the display panel 100 correspondingly disposed in the pixel driving circuit does not have light transmittance, and the plurality of metal film layers reflect, diffract, and interfere with light, the pixel driving circuit is disposed at a periphery of the display light-transmitting region 100c, so that the display light-transmitting region 100c has good light transmittance due to absence of pixel driving circuits in the display light-transmitting region 100c.

Figure 3:
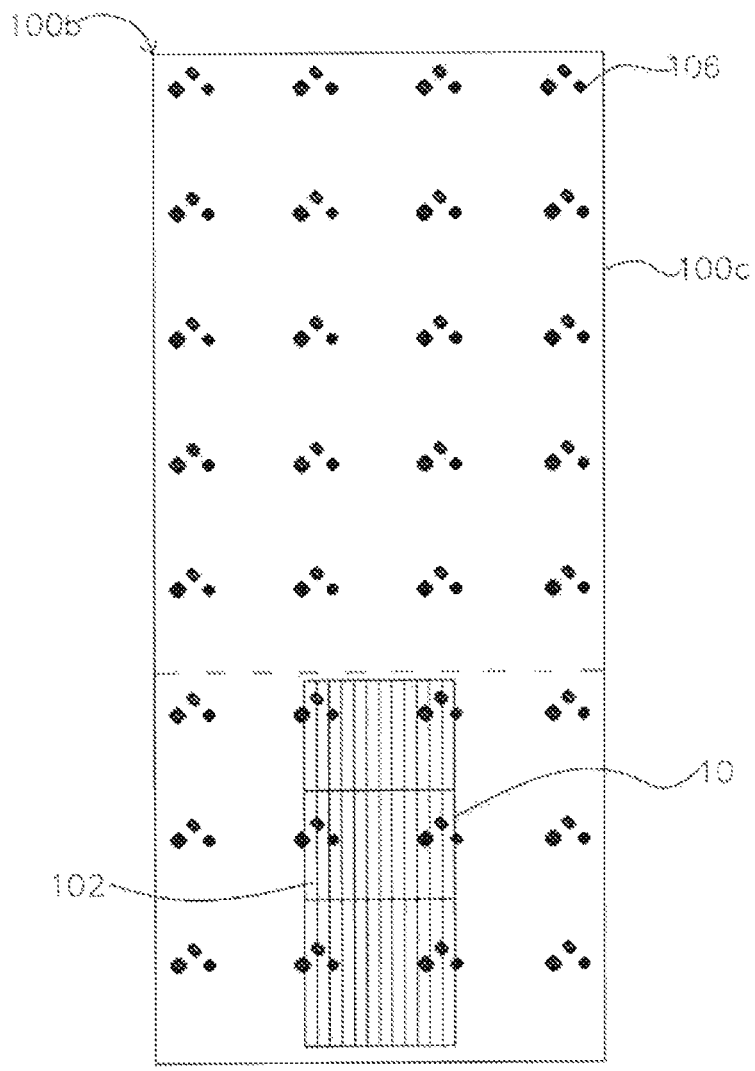
FIG. 3 is a schematic distribution diagram of a first pixel driving circuit in the function additional region provided by the embodiment of the present disclosure.

As shown in FIG. 3, a plurality of the first pixel driving circuits 102 are disposed at a periphery corresponding to the display light-transmitting region 100c, and the first pixel driving circuits 102 is located in the function add-on region 100b. A plurality of display pixels are disposed in the function add-on region 100b, wherein a plurality of first display pixels 106 are disposed in the display light-transmitting region 100c. Each of the first display pixels 106 comprises at least three sub-pixels comprising a first red sub-pixel, a first blue sub-pixel, and a first green sub-pixel, and each of the first display pixels 106 may further comprise a first white sub-pixel. The sub-pixels which form the first display pixel 106 may be any one of organic light-emitting diodes, micro light-emitting diodes, or quantum dot light-emitting diodes. Specifically, the sub-pixels which form the first display pixel 106 are the organic light-emitting diodes.

Figure 4:
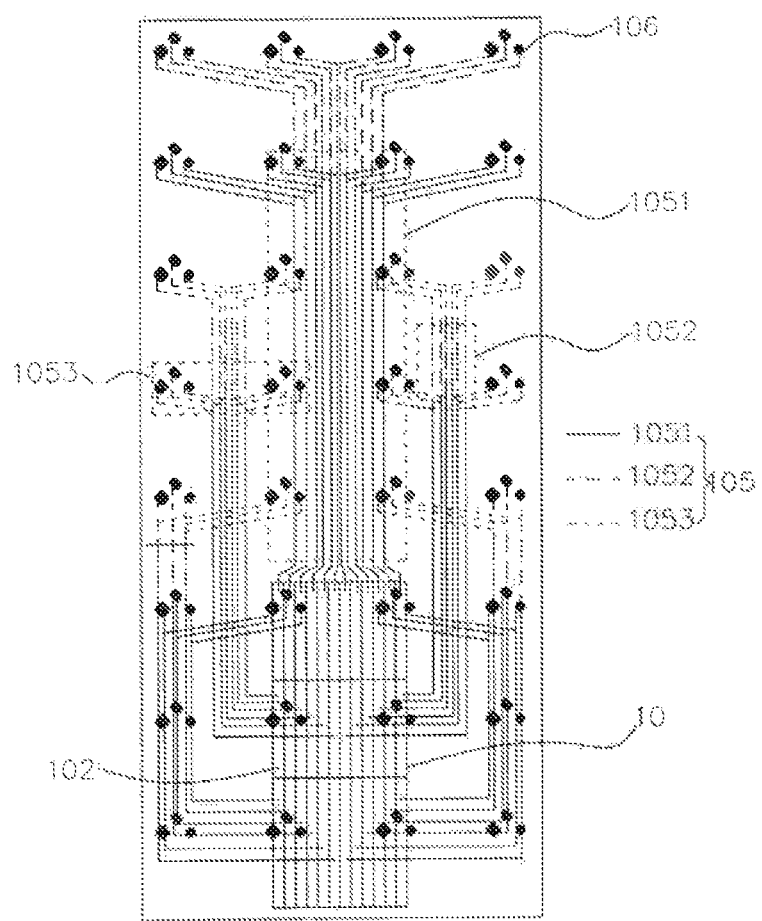
FIG. 4 is a schematic arrangement diagram of a transparent lines of the display panel provided by the embodiment of the present disclosure.

As shown in FIG. 4, a plurality of transparent lines 105 are disposed in the function add-on region 100b, the first display pixels 106 are electrically connected to the first pixel driving circuits 102 through the transparent lines 105, and the plurality of transparent lines 105 comprise at least two layers of the transparent lines 105 on different layers. In the embodiment of the present disclosure, the transparent lines 105 are three layers, the transparent lines 105 comprise a first transparent lines 1051, a second transparent lines 1052, and a third transparent lines 1053, and the first transparent lines 1051, the second transparent lines 1052, and the third transparent lines 1053 are respectively located on different layers. Specifically, a distance between each two adjacent transparent lines 105 on a same layer is greater than 2 μm to prevent short-circuiting between two adjacent transparent lines 105 on the same layer, and a line width of the transparent lines 105 is greater than 1 μm to prevent the transparent lines 105 from open-circuiting due to the line width being too narrow.

In one embodiment, at least a portion of the first display pixels 106 is located in the display light-transmitting region 100a, and a portion of the transparent lines 105 located at the periphery of the display light-transmitting region 100a and in the function add-on region 100b are electrically connected to the first pixel driving circuits 102, that is, the transparent lines 105 are mainly disposed in the display light-transmitting region 100c.

Furthermore, the first display pixel 106 and the first pixel driving circuits 102 may be electrically connected through a layer of the transparent lines 105, and may also be electrically connected through multiple layers of the transparent lines 105. The embodiments of the present disclosure will be descripted from the above two aspects.

In one embodiment, a portion of the first display pixels 106 in the plurality of the first display pixels 106 and the first display pixel driving circuits 102 may be electrically connected through one layer of the transparent lines 105, for example, the first display pixels 106 and the first display pixel driving circuits 102 are electrically connected through the first transparent lines 1051.

Specifically, combined with FIG. 5, the display panel 100 comprises a main display region 100a, a function add-on region 100b, and a display light-transmitting region 100c located in the function add-on region 100b. The display panel 100 further comprises a substrate 101, a plurality of first pixel driving circuits 102, at least three insulating layers 104, a pixel definition layer 108, a plurality of transparent lines 105, a plurality of first display pixels 106, and a plurality of second display pixels 107.

Furthermore, the main display region 100a further comprises the plurality of second display pixels 107 and a plurality of second pixel driving circuits 103. The second display pixels 107 comprise a second pixel anode 1071, and the second pixel driving circuits 103 drive the second display pixels 107 to emit light.

Wherein the substrate 101 may comprise a transparent insulating substrate; for example, the substrate 101 may comprise any one of glass substrate, quartz substrate, or transparent resin substrate, and the transparent resin substrate may comprise polyimide resin. The plurality of first pixel driving circuits 102 are located at the periphery of the display light-transmitting region 100c and on the substrate 101 in the function add-on region 100b, and the plurality of second pixel driving circuits 103 are further disposed on the substrate 101 of the main display region 100a. At least two of the insulating layers 104 cover the plurality of first pixel driving circuits 102 and the plurality of second pixel driving circuits 103. The transparent lines 105 are disposed between the at least two insulating layers 104. The plurality of first display pixels 106 are disposed at a side of the insulating layers 104 away from the substrate 101 and located in the display light-transmitting region 100c, and each of the first display pixels 106 comprises a first pixel anode 1061. The plurality of second display pixels 107 are disposed at a side of the insulating layers 104 away from the substrate 101 and located in the main display region 100a, each of the second display pixels 107 comprises a second pixel anode 1071, and one of the second pixel driving circuits 103 is correspondingly disposed below each sub-pixel forming the second display pixels 107. The pixel definition layer 108 covers the first pixel anode 1061, the second pixel anode 1071, and the insulating layers 104.

In the embodiment of the present disclosure, the insulating layers 104 are four layers, and specifically comprise a first insulating layer 1041, a second insulating layer 1042, a third insulating layer 1043, and a fourth insulating layer 1044. Wherein, the first insulating layer 1041 covers the first pixel driving circuits 102 and the second pixel driving circuits 103, the first transparent lines 1051 is disposed on the first insulating layer 1041, at least a portion of the first transparent lines 1051 is located in the function add-on region 100b, and another portion of the first transparent lines 1051 is located in the display light-transmitting region 100c. The second insulating layer 1042 covers the first insulating layer 1041 and the first transparent lines 1051, the second transparent lines 1052 is disposed on the second insulating layer 1042, and the second transparent lines 1052 is located in the display light-transmitting region 100c. The third insulating layer 1043 covers the second insulating layer 1042 and the second transparent lines 1052, the third transparent lines 1053 is disposed on the third insulating layer 1043, and the third transparent lines 1053 is located in the display light-transmitting region 100c. The fourth insulating layer 1044 covers the third insulating layer 1043 and the third transparent lines 1053. A plurality of first pixel anodes 1061 are located on the fourth insulating layer 1044 of the display light-transmitting region 100c, and a plurality of second pixel anodes 1071 are located on the fourth insulating layer 1044 of the main display region 100a, wherein the first pixel anodes 1061 and the first pixel driving circuits 102 are electrically connected through the first transparent lines 1051. Specifically, the first pixel anodes 1061 and the first transparent lines 1051 are sequentially connected through through-holes which are located on the fourth insulating layer 1044, the third insulating layer 1043, and the second insulating layer 1042 in order and mutually cross-over. The first transparent lines 1051 and the first pixel driving circuits 102 are connected through a through-hole located on the first insulating layer 1041.

Figure 5A:
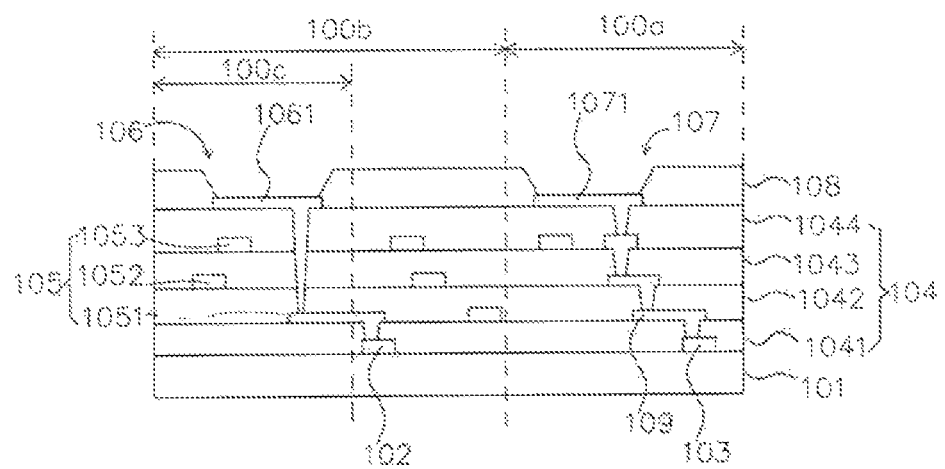
FIG. 5A is a schematic sectional structural diagram of the display panel provided by the embodiment of the present disclosure.
Figure 5B:
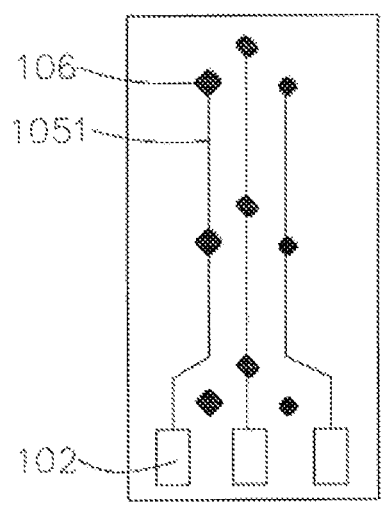
FIG. 5B is a simplified schematic arrangement diagram of the transparent lines of the display panel in FIG. 5A.

As shown in FIG. 5B, which is a simplified schematic arrangement diagram of the transparent lines of the display panel in FIG. 5A, the first display pixel 106 and the first pixel driving circuits 102 are electrically connected through the first transparent lines 1051.

And then, referring to FIG. 4, a portion of the first display pixels 106 in the plurality of first display pixels 106 and the first pixel driving circuits 102 are electrically connected through the transparent lines 105, and the first display pixels 106 and the first pixel driving circuits 102 are electrically connected through the second transparent lines 1052.

Figure 6A:
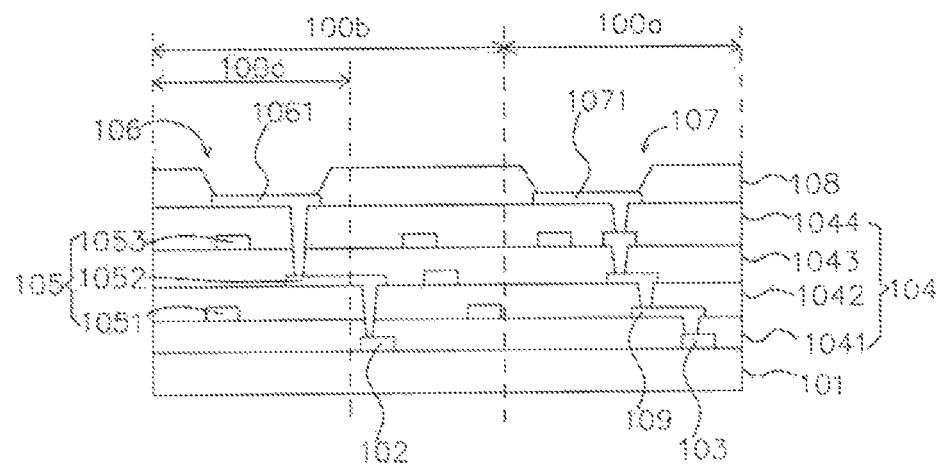
FIG. 6A is a second schematic sectional structural diagram of the display panel provided by the embodiment of the present disclosure.
Figure 6B:
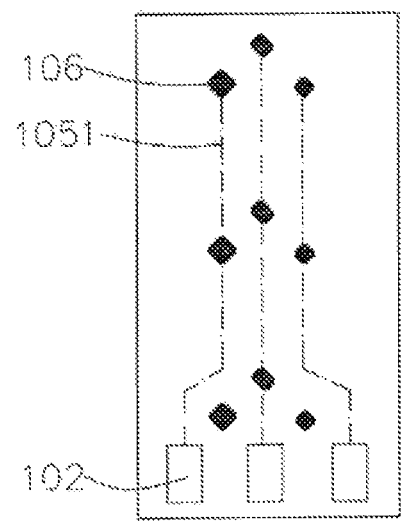
FIG. 6B is a simplified schematic arrangement diagram of the transparent lines of the display panel in FIG. 6A.

Specifically, combined with FIG. 6A, the difference between FIG. 6A and FIG. 5A is that the first transparent lines 1051 is located in the display light-transmitting region 100c, at least a portion of the second transparent lines 1052 is located in the function add-on region 100b, and another portion of second transparent lines 1052 is located in the display light-transmitting region 100c. The first pixel anodes 1061 and the first pixel driving circuits 102 are electrically connected through the second transparent lines 1052. Specifically, the first pixel anodes 1061 and the second transparent lines 1052 are connected through the through-holes located on the fourth insulating layer 1044, and the second transparent lines 1052 and the first pixel driving circuits 102 are sequentially connected through the through-holes which are located on the third insulating layer 1043, the second Insulating layer 1042, and the first insulating layer 1041 in order and mutually cross-over.

As shown in FIG. 68, which is a simplified schematic arrangement diagram of the transparent lines of the display panel in FIG. 6A, the first display pixel 106 and the first pixel driving circuits 102 are electrically connected through the second transparent lines 1052.

And then, referring to FIG. 4, the portion of the first display pixels 106 in the plurality of first display pixels 106 and the first pixel driving circuits 102 are electrically connected through the transparent lines 105, and the first display pixels 106 and the first pixel driving circuits 102 are electrically connected through the third transparent lines 1053.

Figure 7A:
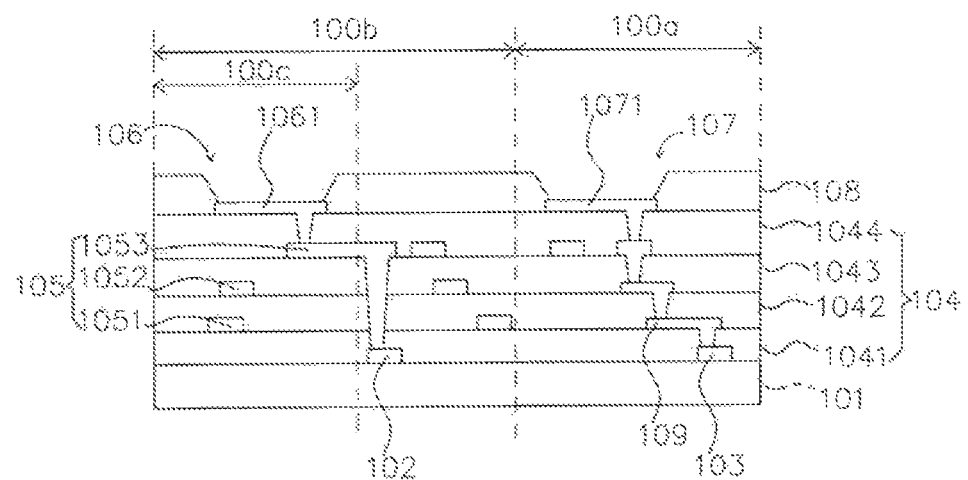
FIG. 7A is a third schematic sectional structural diagram of the display panel provided by the embodiment of the present disclosure.

Specifically, combined with FIG. 7A, the difference between FIG. 7A and FIG. 5A is that the first transparent lines 1051 is located in the display light-transmitting region 100c, at least a portion of the third transparent lines 1053 is located in the function add-on region 100b, and another portion of the third transparent lines 1053 is located in the display light-transmitting region 100c. The first pixel anodes 1061 and the first pixel driving circuits 102 are electrically connected through the third transparent lines 1053. Specifically, the first pixel anodes 1061 and the third transparent lines 1053 are connected through the through-holes located on the fourth insulating layer 1044 and the third insulating layer 1043, and the third transparent lines 1053 and the first pixel driving circuits 102 are sequentially connected through the through-holes which are located on the second insulating layer 1042 and the first insulating layer 1041 in order and mutually cross-over.

Figure 7B:
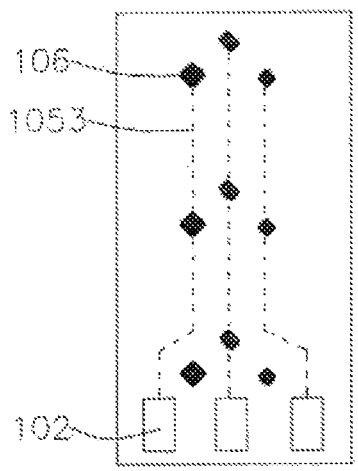
FIG. 7B is a simplified schematic arrangement diagram of the transparent lines of the display panel in FIG. 7A.

As shown in FIG. 7B, which is a simplified schematic arrangement diagram of the transparent lines of the display panel in FIG. 7A, the first display pixel 106 and the first pixel driving circuits 102 are electrically connected through the third transparent lines 1053.

In one embodiment, referring to FIG. 4, the portion of the first display pixels 106 in the plurality of first display pixels 106 and the first pixel driving circuits 102 are electrically connected through multiple layers of the transparent lines 105; for example, the portion of the first display pixels 106 in the plurality of first display pixels 106 and the first pixel driving circuits 102 are electrically connected through two layers of the transparent lines 105.

Figure 8A:
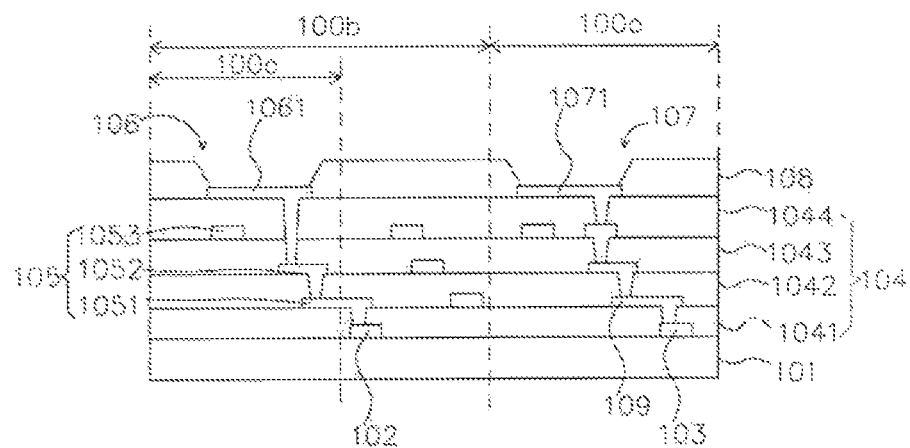
FIG. 8A is a fourth schematic sectional structural diagram of the display panel provided by the embodiment of the present disclosure.

Specifically, combined with FIG. 8A, the difference between FIG. 6A and FIG. 5A is that the first pixel anodes 1061 and the first pixel driving circuits 102 are electrically connected through the second transparent lines 1052 and the first transparent lines 1051 in order. Specifically, the first pixel anodes 1061 and the second transparent lines 1052 are sequentially connected through the through-holes which are located on the fourth insulating layer 1044 and the third insulating layer 1043 in order and mutually cross-over. The second transparent lines 1052 and the first transparent lines 1051 are connected through the through-hole located on the second insulating layer 1042, and the first transparent lines 1051 and the first pixel driving circuits 102 are connected through the through-hole located on the first insulating layer 1041.

Furthermore, an orthographic projection of the first transparent lines 1051 is at least partially overlapped with an orthographic projection of the second transparent lines 1052 on the substrate 101. Adoption of this method of laminated wiring, is beneficial for increasing the number of the transparent lines 105, thereby increasing the area of the display light-transmitting region 100c to improve its light transmittance.

Figure 8B:
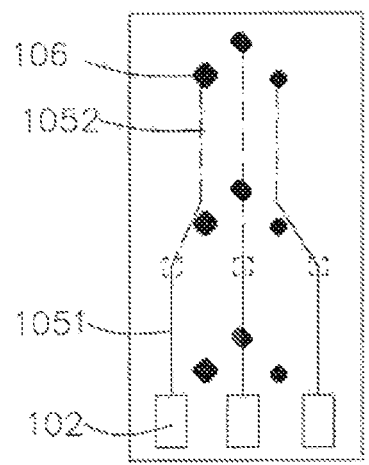
FIG. 8B is a simplified schematic arrangement diagram of the transparent lines of the display panel in FIG. 8A

As shown in FIG. 8B, which is a simplified schematic arrangement diagram of the transparent lines of the display panel in FIG. 8A, the first display pixels 106 and the first pixel driving circuits 102 are electrically connected through the second transparent lines 1052 and the first transparent lines 1051 in order.

It should be noted that the first pixel anode 1061 and the first pixel driving circuits 102 may also be electrically connected through the third transparent lines 1053 and the first transparent lines 1051 in order, or the first pixel anode 1061 and the first pixel driving circuits 102 may also be electrically connected through the third transparent lines 1053 and the second transparent lines 1052 in order, and it is not described herein again.

And then, referring to FIG. 4, the portion of the first display pixels 106 in the plurality of first display pixels 106 and the first pixel driving circuits 102 are electrically connected through three layers of the transparent lines 105.

Figure 9A:
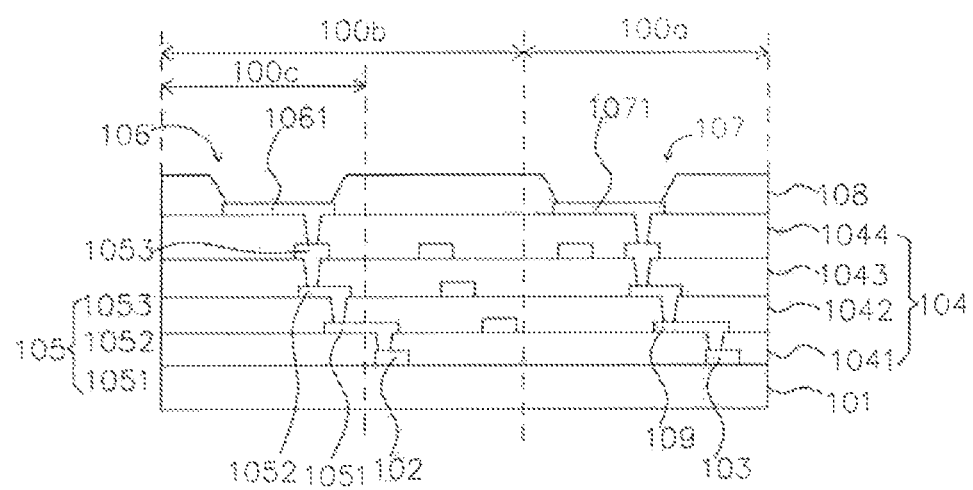
FIG. 9A is a fifth schematic sectional structural diagram of the display panel provided by the embodiment of the present disclosure.

Specifically, combined with FIG. 9A, the difference between FIG. 9A and FIG. 5A is that the first pixel anodes 1061 and the first pixel driving circuits 102 are electrically connected through the third transparent lines 1053, the second transparent lines 1052, and the first transparent lines 1051 in order. Specifically, the first pixel anodes 1061 and the third transparent lines 1053 are connected through the through-hole located on the fourth insulating layer 1044, the third transparent lines 1053 and the second transparent lines 1052 are connected through the through-hole located on the third insulating layer 1043, the second transparent lines 1052 and the first transparent lines 1051 are connected through the through-hole located on the second insulating layer 1042, and the first transparent lines 1051 and the first pixel driving circuits 102 are connected through the through-hole located on the first insulating layer 1041.

Figure 9B:
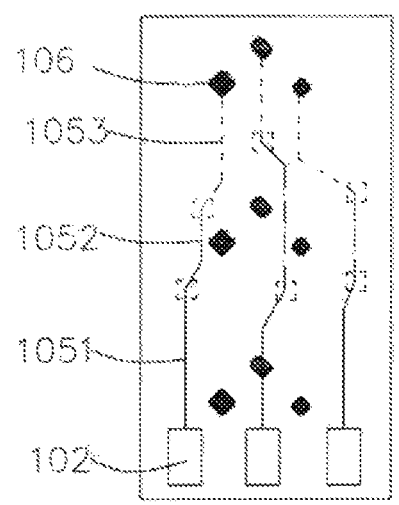
FIG. 9B is a simplified schematic arrangement diagram of the transparent lines of the display panel in FIG. 9A.

As shown in FIG. 9B, which is a simplified schematic arrangement diagram of the transparent lines of the display panel in FIG. 9A, the first display pixel 106 and the first pixel driving circuits 102 are electrically connected through the third transparent lines 1053, the second transparent lines 1052, and the first transparent lines 1051 in order.

In one embodiment, at least a portion of the first pixel anodes 1061 is located in the main display region, and the portion of the transparent lines located in the function add-on region 100b is electrically connected to the first pixel driving circuits 102; that is, the transparent lines 105 can be simultaneously disposed in the main display region 100a and electrically connected to the first pixel driving circuits 102 and the first pixel anodes 1061, which further increases wiring space of the transparent lines 105 to prevent short-circuiting problems caused by narrow interval between adjacent transparent lines 105 on the same layer.

Figure 10A:
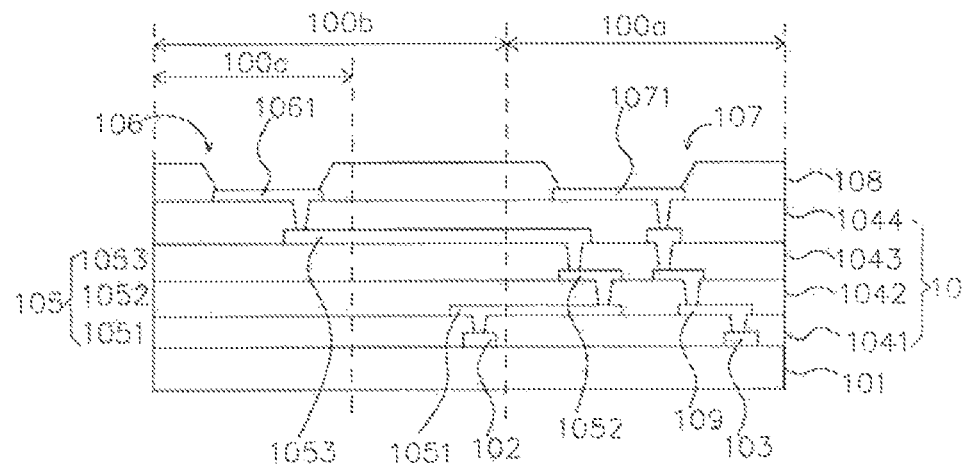
FIG. 10A is a fifth schematic sectional structural diagram of the display panel provided by the embodiment of the present disclosure.

As shown in FIG. 10A, the difference between FIG. 10A and FIG. 5A is that the first transparent lines 1051 is disposed on the first insulating layer 1041, the portion of the first transparent lines 1051 is located in the function add-on region 100b, and another portion of the first transparent lines 1051 extends from the function add-on region 100b to the main display region 100a. The second insulating layer 1042 covers the first insulating layer 1041 and the first transparent lines 1051, the second transparent lines 1052 is disposed on the second insulating layer 1042, and the second transparent lines 1052 is located in the main display region 100a. The third insulating layer 1043 covers the second insulating layer 1042 and the second transparent lines 1052, and the third transparent lines 1053 extends from the main display region 100a through the function add-on region 100b to the display light-transmitting region 100c. The fourth insulating layer 1044 covers the third insulating layer 1043 and the third transparent lines 1053. The first pixel anode 1061 and the first pixel driving circuits 102 are electrically connected sequentially through the third transparent lines 1053, the second transparent lines 1052, and the first transparent lines 1051.

It could be noted that at least the portion of the first pixel anodes 1061 of the portion of the first display pixels 106 near the main display region 100a is located in the main display region 100a, and the portion of the transparent lines 105 located at the periphery of the display light-transmitting region 100c and in the function add-on region 100b is electrically connected to the first pixel driving circuits 102. Moreover at least the portion of the first pixel anodes 1061 of the portion of the first display pixels 106 away from the main display region 100a is located in the display light-transmitting region 100c, and the portion of the transparent lines 105 located at the periphery of the display light-transmitting region 100c and in the function add-on region 100b is electrically connected to the first pixel driving circuits 102, which reduce the overall wiring space required for the transparent lines 105, and further increase the number of the transparent lines 105.

Figure 10B:
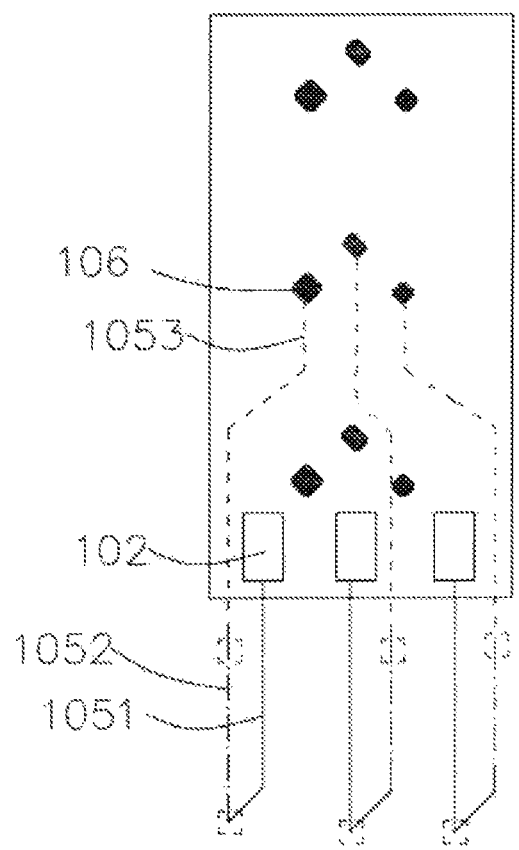
FIG. 10B is a simplified schematic arrangement diagram of the transparent lines of the display panel in FIG. 10A.

As shown in FIG. 10B, which is a simplified schematic arrangement diagram of the transparent lines of the display panel in FIG. 10A, the first display pixel 106 and the first pixel driving circuits 102 are electrically connected through the portion of the third transparent lines 1053 located in the function add-on region 100b, the portion of the third transparent lines 1053 located in the main display region 100a, the portion of the second transparent lines 1052 located in the function add-on region 100b, the portion of the second transparent lines 1052 located in the main display region 100a, and the first transparent lines 1051 located in the function add-on region 100b in order.

Specifically, materials of the insulating layers 104 may be a transparent organic material or an inorganic material, such as any one of silicon dioxide, silicon nitride, polyimide, or a photoresist material, and materials of the transparent lines 105 may be transparent conductor materials, such as any one of indium oxide, indium zinc oxide, or silver nanowires. Because the transparent lines 105 have better light transmittance, its light transmittance may generally reach more than 90%, which can reduce loss of light passing through the transparent lines 105 to improve the light transmittance of the display light-transmitting region 100c.

Furthermore, referring to FIG. 5A, FIG. 6A, FIG. 7A, FIG. 8A, FIG. 9A, and FIG. 10A, the display panel 100 further comprises a conductive layer 109 disposed between at least two insulating layers 104. The conductive layer 109 is located in the main display region 100a, and the second pixel anode 1071 of the second display pixel 107 is electrically connected to the second pixel driving circuit 103 through the conductive layer 109, so that the second pixel driving circuit 103 drives the second display pixel 107 to emit light, enhancing conductivity. It should be noted that the wiring method and material of the conductive layer 109, and the electrical connection method of the second pixel anode 1071 and the second pixel driving circuit 103 may be same as the transparent lines 105. The conductive layer 109 is made with the same process as the transparent lines 105, which is beneficial for saving process steps and reducing production costs. Refer to the foregoing embodiments for details, and it is not described herein again.

In the embodiment of the present disclosure, the transparent lines 105 are three layers, but it is not limited herein. In other embodiments, the transparent lines 105 may be four layers, five layers, or even more layers. It could be noted that the greater the number of layers of the transparent lines 105, the larger the wiring space for the transparent lines 105, which is beneficial for increasing the number of the transparent lines 105 to increase the area of the display light-transmitting region 100c. However, due to the difficulty of manufacturing process and the excessive number of layers of the transparent lines 105, a risk of poor electrical contact between two adjacent transparent lines 105 will increase; hence, the number of layers of the transparent lines 105 should be based on actual situation.

Furthermore, a plurality of signal lines are disposed on the substrate 101 in the function add-on region 100b and located at the periphery of the display light-transmitting region 100c, and the plurality of signal lines are electrically connected to the plurality of first pixel driving circuits 102 for transmitting a signal driving the first display pixel 106 to the first pixel anode 1061. Since the signal lines also have a light shielding function, the signal lines are disposed at the periphery of the display light-transmitting region 100c, so that the display light-transmitting region 100c can further improve its light transmittance because the signal lines are not disposed.

Specifically, an area of the function add-on region 100b occupied by the first pixel driving circuits 102, the signal lines, and the first pixel anodes 1061 is less than or equal to 50%, and an area of the display light-transmitting region 100c occupied by the plurality of first pixel anodes 1061 is less than 50%, in order to ensure that the display light-transmitting region 100c has a sufficient light-transmitting area. In the embodiment of the present disclosure, a size of the display light-transmitting region ranges from 600 μm to 10000 μm, and a size of each of the first pixel anodes 1061 is less than a size of each of the second pixel anodes 1071, so that a size of the sub-pixels of the first display pixels 106 is less than a size of the sub-pixels of the second display pixels 107 and the display light-transmitting region 100c has higher light transmittance.

A pixel density of the first display pixels 106 in the display light-transmitting region 100c may be less than a pixel density of the second display pixels 107 in the main display region 100a, so that a light transmittance of the display light-transmitting region 100c is greater than a light transmittance of the main display region 100a. The size of the first display pixels 106 in the display light-transmitting region 100c may be less than the size of the second display pixels 107 in the main display region 100a, so that the light transmittance of the display light-transmitting region 100c is greater than the light transmittance of the main display region 100a.

Furthermore, as shown in FIG. 3 and FIG. 4, the plurality of the first pixel driving circuits 102 are arranged in an array to form a pixel driving circuit island 10, the first pixel anodes 1061 and the pixel driving circuit island 10 are electrically connected through the transparent lines 105, and each of the pixel driving circuit islands 10 comprises the plurality of first pixel driving circuits 102. It could be noted that each of the pixel driving circuit islands 10 is formed by centralized gathering the plurality of the first pixel driving circuits 102 in an island shape, and the centralized gathering is dispersed relative to the pixel driving circuits. Specifically, a farthest distance between the first display pixel and the pixel driving circuit island ranges from 300 μm to 5000 μm.

Figure 11:
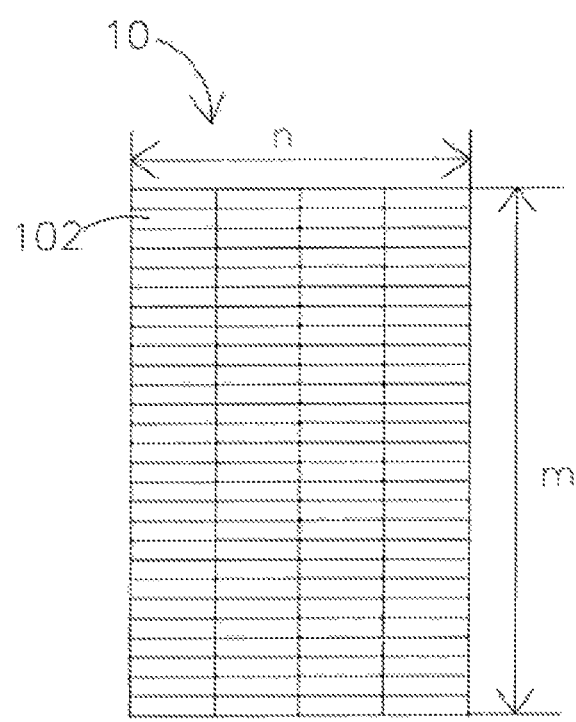
FIG. 11 is a schematic structural diagram of a pixel driving circuit island provided by the embodiment of the present disclosure.

As shown in FIG. 11, which is a schematic structural diagram of a pixel driving circuit island 10 provided by the embodiment of the present disclosure, each of the pixel driving circuit islands 10 includes m×n arrays of the first pixel driving circuits 102, wherein m is a number of columns of the first pixel driving circuits 102, n is a number of rows of the first pixel driving circuits 102, m and n are positive integers, and at least one of m or n is greater than 1. Wherein a range of m is greater than or equal to 3 and less than 128, and a range of n is greater than or equal to 1 and less than 128. Furthermore, the range of m is greater than or equal to 3 and less than 64, and the range of n is greater than or equal to 1 and less than 64.

Figure 12A:
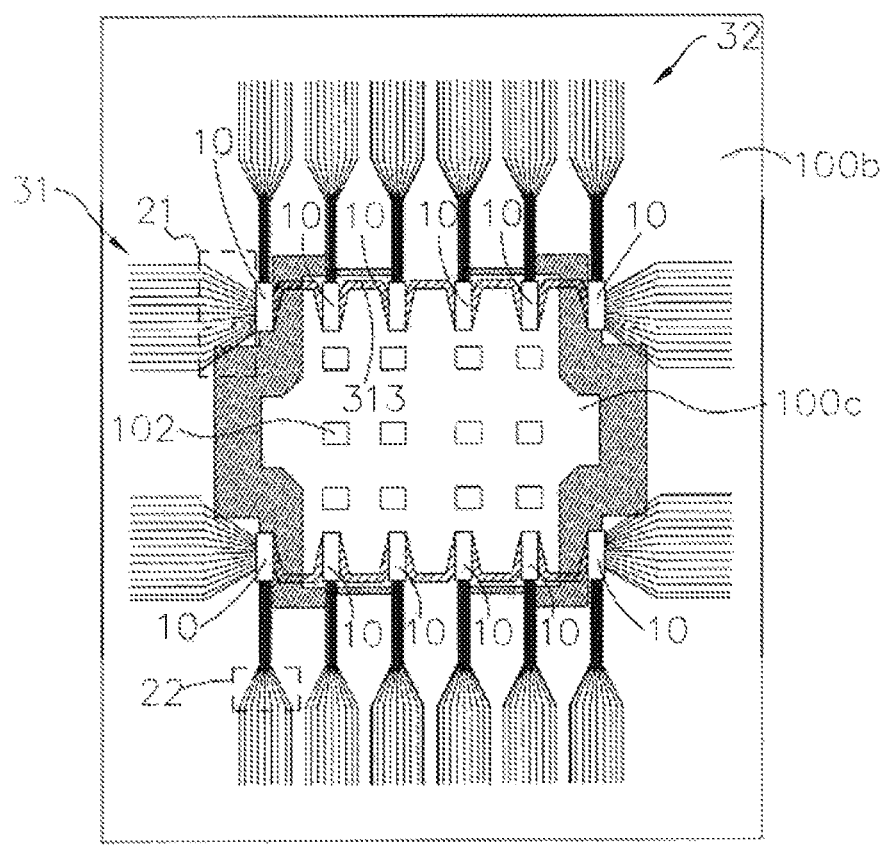
FIG. 12A and FIG. 12B are first schematic arrangement diagrams of a driving circuit and a signal provided by the embodiment of the present disclosure.
Figure 12B:
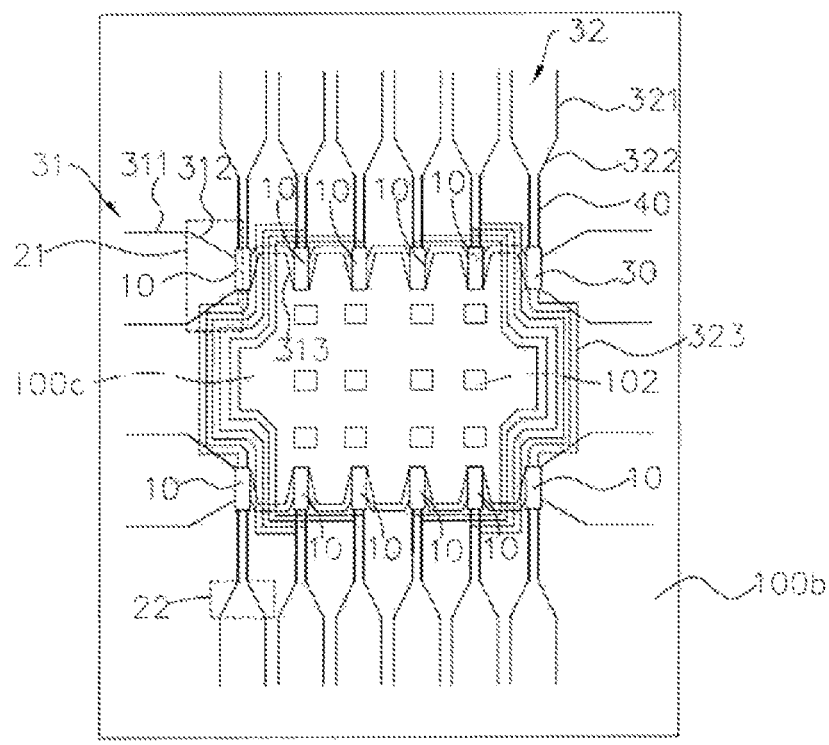

As shown in FIG. 12A and FIG. 12B, the plurality of pixel driving circuit islands 10 and signal lines formed by gathering the plurality of first pixel driving circuits 102 are disposed on a peripheral side of the display light-transmitting region 100c. Wherein the signal lines are electrically connected to the first pixel driving circuits 102 to input various electric signals to the pixel driving circuit islands 10. The pixel driving circuit islands 10 and signal lines are not disposed in the display light-transmitting region 100c.

It should be noted that a setting of the first pixel driving circuits 102 needs to occupy a certain area. The first pixel driving circuits 102 are relatively gathered to form the pixel driving circuit island 10, which may increase an area size of the display light-transmitting region 100c. The first pixel driving circuits 102 and the signal lines for driving the first display pixels 106 are disposed at the peripheral side of the display light-transmitting region 100c to ensure that the pixel driving circuit island 10 is not disposed in the display light-transmitting region 100c, thereby preventing the first pixel driving circuits 102 and the signal lines from affecting display and light transmittance of the display light-transmitting region 100c.

It should be noted that the first pixel driving circuits 102 may be used to drive the plurality of first display pixels 106 in the display light-transmitting region 100c to ensure that the pixel driving circuit is not disposed in the display light-transmitting region 100c, so that the display light-transmitting region 100c has high light transmittance. The first pixel driving circuits 102 may further be used to drive the first display pixels 106 in the function add-on region 100b other than the display light-transmitting region 100c.

It should be noted that the first pixel driving circuits 102 and the signal lines may be disposed in the function add-on region 100b, or may be disposed on the main display region 100a. The pixel driving circuit island 10 can not only drive the first display pixels 106 in the function add-on region 100b, but can also drive the portion of the second display pixels 107 in the function add-on region 100b near the main display region 100a.

Specifically, the signal lines comprise a plurality of first signal lines 31 and a plurality of second signal lines 32, and both the first signal lines 31 and the second signal lines 32 are electrically connected to the pixel driving circuit island 10 to input various electrical signals to the pixel driving circuit island 10. The pixel driving circuit island 10 is electrically connected to the first pixel anode 1061 through the transparent lines 105 to transmit electrical signals to the first pixel anode 1061.

Wherein the first signal lines 31 may comprise at least one of scan lines, light-emitting signal lines controlling light emission of organic light-emitting diodes, or reset lines controlling anode reset of the organic light-emitting diodes. Each of the first signal lines 31 comprises a first straight segment 311, a first roundabout segment 313, and a first transition segment 312.

Specifically, the display panel 100 further comprises a plurality of first fan-shaped regions 21 and a plurality of second fan-shaped regions 22, the first fan-shaped regions 21 are regions defined by the plurality of first transition segments 312 in a fan-shaped arrangement, and the second fan-shaped regions 22 are regions defined by a plurality of second transition segments 322 in a fan-shaped arrangement.

Wherein, the plurality of first straight segments 311 are arranged horizontally and in parallel, the first transition segments 312 is located in the first fan-shaped regions 21, and the plurality of first transition segments 312 are fan-shaped distributed in the first fan-shaped regions 21. The first straight segments 311 extend to the first fan-shaped regions 21 and are electrically connected to the first transition segments 312, so that the plurality of first signal lines 31 are integrated into a plurality of groups of first signal lines 31 and an extension path of the plurality of groups of the first signal lines 31 is changed to avoid the display light-transmitting region 100c. An interval between two adjacent first transition segments 312 in the first fan-shaped regions 21 is less than an interval between two adjacent first straight segments 311. In order to prevent short-circuiting caused by narrow interval between adjacent first transition segments 31, the plurality of first transition segments 312 of the first fan-shaped regions 21 are divided into at least two layers.

Wherein, the first roundabout segment 313 is electrically connected to all the pixel driving circuit islands 10 in a first group of pixel driving circuit islands 10 in order, and the first roundabout segment 313 may also be a straight line, an arc shape, or include multiple polyline segments.

Specifically, the second signal lines 32 may comprise a data line, and each of the second signal lines 32 comprises a second straight segment 321, a second roundabout segment 323, and a second transition segment 322.

Wherein, the plurality of second straight segments 321 of the plurality of second signal lines 32 are arranged vertically and in parallel. A vertical projection of the plurality of first straight segments 311 of the plurality of first signal lines 31 on the display panel 100 and a vertical projection of the plurality of second straight segments 321 of the plurality of second signal lines 32 on the display panel 100 mutually perpendicularly intersect. The second transition segments 322 is located in the second fan-shaped regions 22, and the plurality of second transition segments 322 are fan-shaped distributed in the second fan-shaped regions 22. The second straight segments 321 extend to the second fan-shaped regions 22 and are electrically connected to the second transition segments 322, so that the plurality of second signal lines 32 are integrated into a plurality of clusters of second signal lines 32, and an extension path of the plurality of clusters of the second signal lines 32 is changed to avoid the display light-transmitting region 100c. An interval between two adjacent second transition segments 322 in the second fan-shaped regions 22 is less than an interval between two adjacent second straight segments 321.

The plurality of second straight segments 321 of the plurality of second signal lines 32 are divided into a plurality of clusters respectively extending to the plurality of second fan-shaped regions 22 to be electrically connected to the plurality of second transition segments 322. Each cluster of the first straight segments 311 correspondingly extends into a second fan-shaped regions 22. The plurality of second transition segments 322 are divided into a plurality of clusters, and each cluster of the second transition segments 322 is located in the same second fan-shaped regions 22. The plurality of second fan-shaped regions 22 are symmetrically disposed on opposite sides of the function add-on region 100b and are disposed near a first roundabout line. The second roundabout segments 323 of the plurality of second signal lines 32 are disposed at edges of the display light-transmitting region 100c. The second transition segments 322 are one-to-one electrically connected the second roundabout segments 323. The first roundabout segments 313 and the second roundabout segments 323 are located on different layers.

Wherein, two ends of each cluster of the second roundabout segments 323 are respectively electrically connected to one cluster of the second transition segments 322; that is, the second roundabout segments 323 are electrically connected to the second transition segments 322.

It should be noted that a region surrounded by the plurality of first roundabout segments 313, the plurality of second roundabout segments 323, and at least the portion of the pixel driving circuit islands 10 are the display light-transmitting region 100c.

Furthermore, the display light-transmitting region 100c corresponds to a convex edge or a concave edge of the first group of pixel driving circuit islands 10 located at edges of the first roundabout segments 313, which increases a light-transmitting area of the display light-transmitting region 100c in the function add-on region 100b.

As shown in FIG. 12B, the display panel 100 further comprises a plurality of connecting lines 40, and the connecting lines 40 and the second roundabout segments 323 are located on different layers. Each group of second roundabout segments 323 comprises at least two clusters of the second roundabout segments 323 of different lengths. Two ends of each cluster of the second roundabout segments 323 are respectively electrically connected to two pixel driving circuit islands 10 of the first group of pixel driving circuit islands 10 through connection lines 40, preventing two adjacent clusters of the second roundabout segments 323 in the same group from short-circuiting caused by intersecting in a bid to achieve electrical connection with the pixel driving circuit island 10 during extension.

Figure 13A:
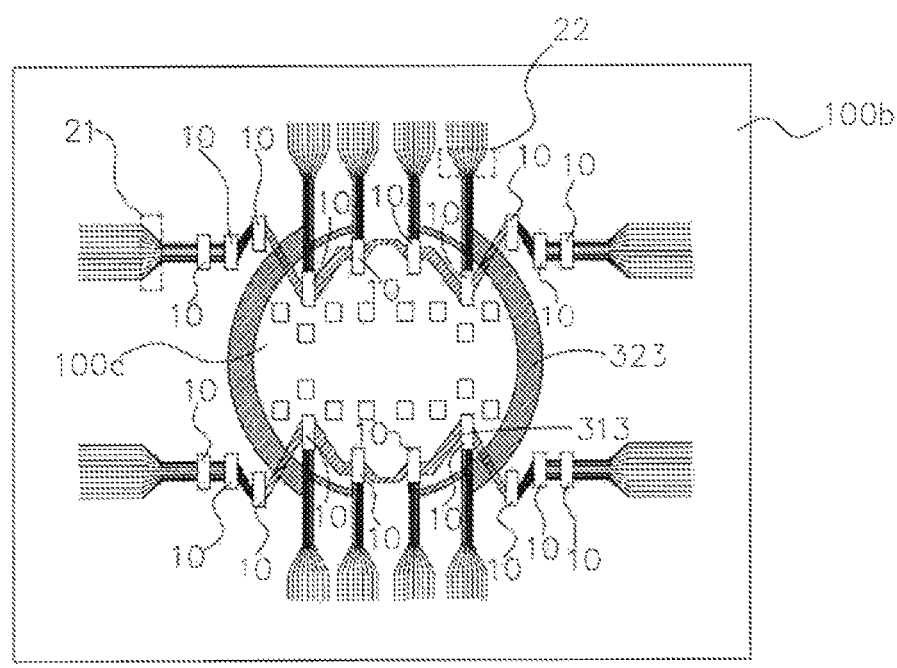
FIG. 13A and FIG. 13B are second schematic arrangement diagrams of the driving circuit and the signal provided by the embodiment of the present disclosure.
Figure 13B:
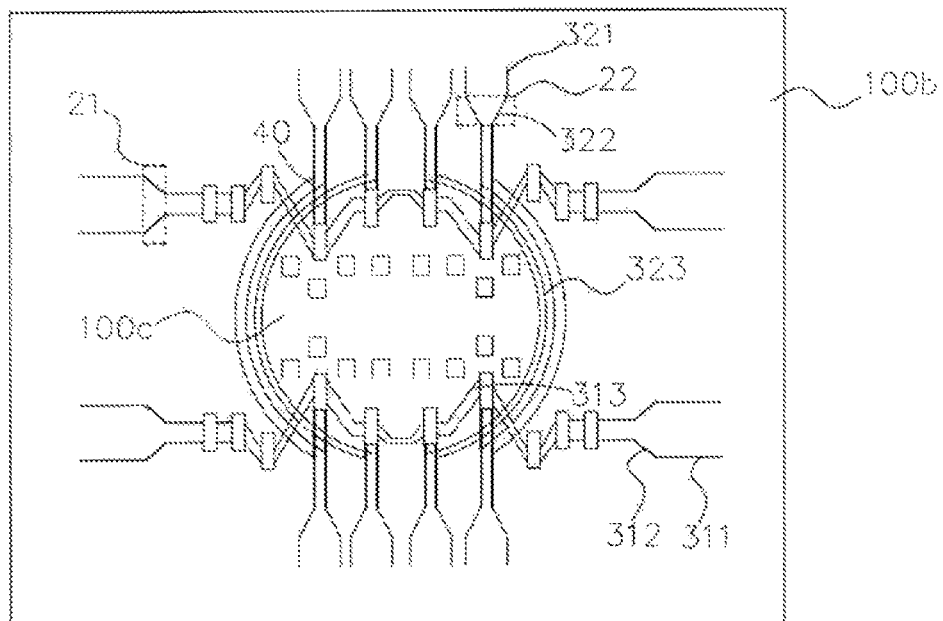

As shown in FIG. 13A and FIG. 13B, a structure of the display panel 100 shown in FIG. 13A is basically similar to a structure of the display panel 100 shown in FIG. 12A, and the difference is that the second roundabout segments 323 of the second signal lines 32 are arranged in an arc.

Specifically, the second roundabout segments 323 of the second signal lines 32 is arranged in a circular arc; meanwhile, an overall shape of the light-transmitting region 100c is circular. The second roundabout segments 323 of the second signal lines 32 are arranged in an elliptical arc; meanwhile, the overall shape of the light-transmitting region 100c is ellipse.

Figure 14A:
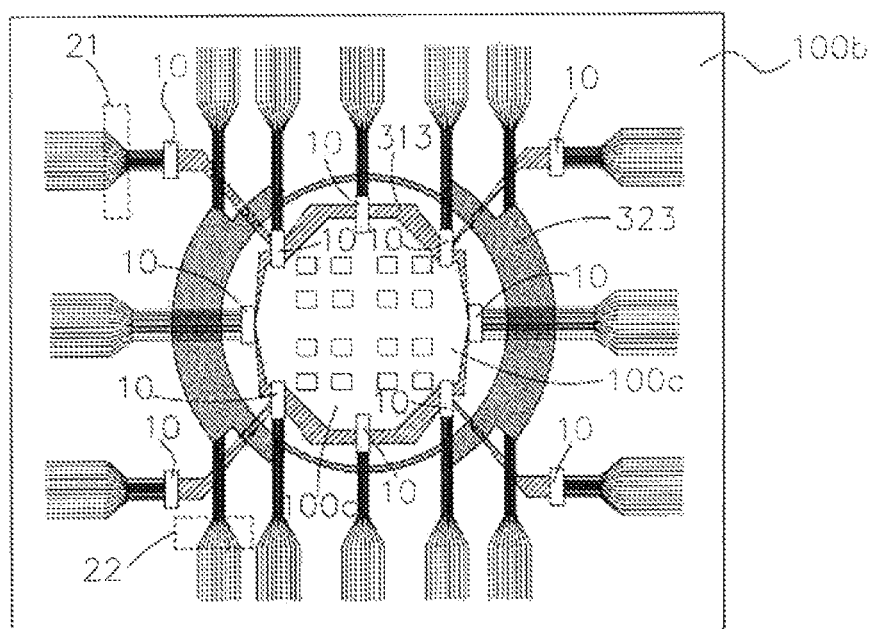
FIG. 14A and FIG. 14B are third schematic arrangement diagrams of the driving circuit and the signal provided by the embodiment of the present disclosure.
Figure 14B:
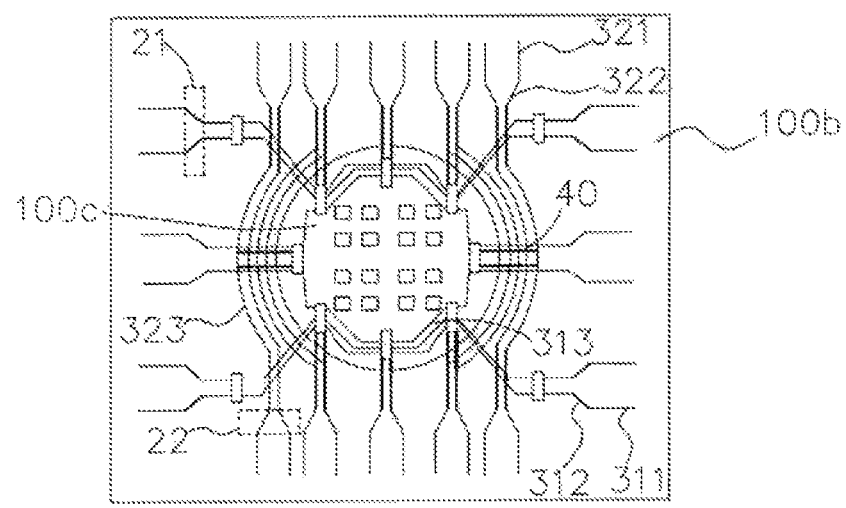

As shown in FIG. 14A and FIG. 14B, a structure of the display panel 100 shown in FIG. 14A is basically similar to the structure of the display panel 100 shown in FIG. 12A, and the difference is that at least a portion of the second roundabout segments 323 of the second signal lines 32 are disposed around the overall display light-transmitting region 100c.

The portion of the pixel driving circuit islands 10 are arranged uniformly in a ring-shape at an edge of the light-transmitting region 100c. The second roundabout segments 323 of the plurality of second signal lines 32 are disposed around the light-transmitting region 101 and are electrically connected to at least the portion of the pixel driving circuit islands 10 in order. The first roundabout segments 313 of the plurality of first signal lines 31 are sequentially electrically connected to any two adjacent pixel driving circuit islands 10 of the pixel driving circuit islands 10.

Furthermore, the first pixel driving circuits 102 and the second pixel driving circuits 103 adopt different circuit structures, so that the area of the function add-on region 100b occupied by the first pixel driving circuits 102 is less than the area of the function add-on region 100b occupied by the second pixel driving circuits 103, thereby increasing the size of the display light-transmitting region 100c.

For example, a device area of the first pixel driving circuits 102 is less than a device area of the second pixel driving circuits 103, and the device area is mainly determined by a number of devices and the sizes of devices. Specifically, when the first pixel driving circuits 102 adopt 2T1C, 4T1C, and 7T1C circuit structures. Furthermore, a device size of the first pixel driving circuits 102 is less than a device size of the second pixel driving circuits 103, meanwhile, the first pixel driving circuits 102 can also adopt 7T1C circuit structure.

Moreover, a wiring space of the first pixel driving circuits 102 is less than a wiring space of the second pixel driving circuits 103, Specifically, when the first pixel driving circuits 102 adopt 2T1C, 4T1C, and 7T1C circuit structures, at least two of the first pixel driving circuits 102 may share one signal line and be symmetrically disposed along the signal line, and the signal line may be a power signal line. The wiring space of the first pixel driving circuits 102 is reduced compared to the wiring space of the second pixel driving circuits 103.

An embodiment of the present disclosure further provides a display device. The display device comprises the aforementioned display panel 100 and a photosensitive element, and the photosensitive element is disposed on a side of the display panel 100 and disposed corresponding to the function additional region 100b, wherein the photosensitive element may be a camera and an optical touch component.

Advantageous effects of the present disclosure are that the present disclosure provides a display panel and a display device. A plurality of first pixel driving circuits are disposed at a periphery of a display light-transmitting region, and multiple layers transparent lines are disposed to electrically connect a first pixel anode and the first pixel driving circuits, so that the first pixel driving circuits drive a first display pixel to emit light, which is beneficial for increasing wiring space and improving light transmittance of the display light-transmitting region, thereby improving photographing effect and display effect of under-screen cameras.

As mentioned above, while the present disclosure has been disclosed via preferred embodiments as above, the preferred embodiments are not intended to limit the disclosure. Those skilled in the art can make various modifications and alternations without departing from the spirit and scope of the disclosure. The scope of protection of the disclosure is defined by the claims.

What is claimed is:

1. A display panel, comprising a main display region and at least one function add-on region, wherein the function add-on region comprises at least one display light-transmitting region, and a size of the display light-transmitting region ranges from 600 μm to 10000 μm;
    a substrate, wherein a plurality of first pixel driving circuits are disposed at a periphery of the display light-transmitting region and on the substrate in the function add-on region;
    at least two insulating layers covering the plurality of first pixel driving circuits;
    transparent lines disposed between the at least two insulating layers; and
    a plurality of first display pixels disposed at a side of the insulating layers away from the substrate and located in the display light-transmitting region, wherein the first display pixels comprise a first pixel anode; and
    wherein the first pixel anode is electrically connected to at least a portion of the first pixel driving circuits through the transparent lines to drive the first display pixels to emit light.

2. The display panel as claimed in claim 1, wherein at least a portion of the first pixel anode is located in the display light-transmitting region, and a portion of the transparent lines located at the periphery of the display light-transmitting region and in the function add-on region is electrically connected to the first pixel driving circuits.

3. The display panel as claimed in claim 1, wherein at least a portion of the first pixel anode is located in the main display region, and a portion of the transparent lines located at the periphery of the display light-transmitting region and in the function add-on region is electrically connected to the first pixel driving circuits.

4. The display panel as claimed in claim 2, wherein the transparent lines is at least two layers, a through-hole is defined on each of the insulating layers, and two adjacent layers of the transparent lines are electrically connected through the through-hole.

5. The display panel as claimed in claim 4, wherein a portion of the first display pixels in the plurality of the first display pixels of display light-transmitting region is electrically connected to the first display pixel driving circuits through one layer of the transparent line; and a portion of the first display pixels in the plurality of first display pixels is electrically connected to the first display pixel driving circuits through another layer of the transparent line.

6. The display panel as claimed in claim 5, wherein a portion of the first display pixels in the plurality of the first display pixels of display light-transmitting region is electrically connected to the first display pixel driving circuits through multiple layers of the transparent line, wherein orthographic projections of the multiple layers transparent lines on the substrate at least partially overlap.

7. A display panel, comprising a main display region and at least one function add-on region, wherein the function add-on region comprises at least one display light-transmitting region;
- a substrate, wherein a plurality of first pixel driving circuits are disposed at a periphery of the display light-transmitting region and on the substrate in the function add-on region;
- at least two insulating layers covering the plurality of first pixel driving circuits;
- transparent lines disposed between the at least two insulating layers; and
- a plurality of first display pixels disposed at a side of the insulating layers away from the substrate and located in the display light-transmitting region, wherein the first display pixels comprise a first pixel anode;
- wherein the first pixel anode is electrically connected to at least a portion of the first pixel driving circuits through the transparent lines to drive the first display pixels to emit light.

8. The display panel as claimed in claim 7, wherein at least a portion of the first pixel anode is located in the display light-transmitting region, and a portion of the transparent lines located at the periphery of the display light-transmitting region and in the function add-on region is electrically connected to the first pixel driving circuits.

9. The display panel as claimed in claim 7, wherein at least a portion of the first pixel anode is located in the main display region, and a portion of the transparent lines located at the periphery of the display light-transmitting region and in the function add-on region is electrically connected to the first pixel driving circuits.

10. The display panel as claimed in claim 8, wherein the transparent lines is at least two layers, a through-hole is defined on each of the insulating layers, and two adjacent layers of the transparent lines are electrically connected through the through-hole.

11. The display panel as claimed in claim 10, wherein a portion of the first display pixels in the plurality of the first display pixels of display light-transmitting region is electrically connected to the first display pixel driving circuits through one layer of the transparent line; and a portion of the first display pixels in the plurality of first display pixels is electrically connected to the first display pixel driving circuits through another layer of the transparent line.

12. The display panel as claimed in claim 11, wherein a portion of the first display pixels in the plurality of the first display pixels of display light-transmitting region is electrically connected to the first display pixel driving circuits through multiple layers of the transparent line, wherein orthographic projections of the multiple layers transparent lines on the substrate at least partially overlap.

13. The display panel as claimed in claim 7, wherein a plurality of second display pixels are disposed at a side of the insulating layers away from the substrate and located in the main display region, the second display pixels comprise a second pixel anode, and a plurality of second pixel driving circuits are disposed on the substrate of the main display region to drive the second display pixels to emit light.

14. The display panel as claimed in claim 7, wherein a distance between each two adjacent transparent lines disposed on a same layer is greater than 2 μm, and a width of the transparent lines is greater than 1 μm.

15. The display panel as claimed in claim 7, wherein a plurality of signal lines are disposed on the substrate located at the periphery of the display light-transmitting region, and the plurality of signal lines are electrically connected to the plurality of first pixel driving circuits to transmit a signal driving the first display pixel to the first pixel anode.

16. The display panel as claimed in claim 15, wherein an area of the function add-on region occupied by the first pixel driving circuits, the signal lines, and the first pixel anodes is less than or equal to 50%; and
an area of the display light-transmitting region occupied by a plurality of first pixel anodes is less than 50%.

17. The display panel as claimed in claim 7, wherein the plurality of the first pixel driving circuits are arranged in an array to form a pixel driving circuit island, and the first pixel anodes are electrically connected to the pixel driving circuit island through the transparent lines.

18. The display panel as claimed in claim 17, wherein a farthest distance between the first display pixels and the pixel driving circuit island ranges from 300 μm to 5000 μm.

19. The display panel as claimed in claim 7, wherein a conductive layer is disposed between the at least two insulating layers, the conductive layer is located in the main display region, and a plurality of second pixel driving circuits are electrically connected to a plurality of second display pixels to drive the second display pixels to emit light.

20. A display device, comprising the display panel as claimed in claim 7; and
a photosensitive element disposed on a side of the display panel and disposed corresponding to the function additional region.

* * * * *